United States Patent
Sommer

(10) Patent No.: US 6,718,487 B1
(45) Date of Patent: Apr. 6, 2004

(54) METHOD FOR HIGH SPEED TESTING WITH LOW SPEED SEMICONDUCTOR TEST EQUIPMENT

(75) Inventor: Michael Bernhard Sommer, Richmond, VA (US)

(73) Assignee: Infineon Technologies North America Corp., San Jose, CA (US)

( * ) Notice: Subject to any disclaimer, the term of this patent is extended or adjusted under 35 U.S.C. 154(b) by 435 days.

(21) Appl. No.: 09/604,220

(22) Filed: Jun. 27, 2000

(51) Int. Cl.[7] .................................................. H02H 3/05
(52) U.S. Cl. ......................................... 714/42; 714/718
(58) Field of Search ............................. 714/42, 54, 29, 714/30, 718, 724, 733, 734

(56) References Cited

U.S. PATENT DOCUMENTS

| 5,151,903 A | * | 9/1992 | Mydill et al. ................ 714/743 |
| 5,293,386 A | | 3/1994 | Muhmenthaler et al. |
| 5,619,513 A | | 4/1997 | Shaffer et al. |
| 5,737,512 A | * | 4/1998 | Proudfoot et al. ............. 714/32 |
| 5,745,430 A | | 4/1998 | Wong et al. |
| 5,854,797 A | * | 12/1998 | Schwartz et al. ............ 714/724 |
| 5,883,906 A | * | 3/1999 | Turnquist et al. ............ 714/738 |
| 5,903,512 A | | 5/1999 | Wong et al. |
| 6,360,340 B1 | * | 3/2002 | Brown et al. ................ 714/718 |

* cited by examiner

Primary Examiner—Dieu-Minh Le
(74) Attorney, Agent, or Firm—Staas & Halsey LLP

(57) ABSTRACT

A method for testing semiconductor memories, in accordance with the invention includes providing a tester having a plurality of data channels. The tester operates at a first clock rate. A memory device to be tested is included with a plurality of data ports connected to the data channels. The memory device has a data compression circuit for compressing test data such that a number of the plurality of data ports are available for other functions. Data is transferred between the memory device and the tester at a rate higher than the first clock rate by employing the plurality of data ports including the number of the plurality of data ports, such that the memory device operates at the higher rate and the tester operates at the first rate. In other embodiments data ports are made available by employing an on-chip addressing method. In still other embodiments, an on-chip clock receiver provides double data rate clocking of the memory device.

20 Claims, 3 Drawing Sheets

METHOD FOR HIGH SPEED TESTING WITH LOW SPEED SEMICONDUCTOR TEST EQUIPMENT

BACKGROUND

1. Technical Field

This disclosure relates to semiconductor testing, and more particularly, to a method for increasing test throughput by providing a method for increasing test speeds of semiconductor test equipment.

2. Description of the Related Art

Semiconductor devices, especially memory devices, are typically tested by generating a pattern of inputs and transferring the pattern of inputs to the array of memory cells. The data written to the memory cells is then retrieved and compared to the input pattern to identify abnormalities or failures. The failures of the cells are stored in a tester in an address failure memory and correlated to repair the failures by replacing failed cells with redundancies.

In typical set ups, a complete test sequence is run on the tester to identify failures, which are stored in an address fail memory, and perform redundancy calculations. In addition, semiconductor testers include several modules or devices. Among these are a pattern generator, a scrambler, a probe card and socket file. These devices provide different testing configurations and patterns for testing semiconductor wafer components. Wafer testers are typically run by a master program. The master program coordinates all testing functions and modules by setting appropriate parameters for different modules or programs for the wafer tester.

During a test, a device under test (DUT) is coupled to the tester. Testers and probe cards as well as other test equipment tend to be rather large in comparison to the wafers or chips to be tested (DUT). As such, relatively large distances through the test equipment must be overcome to test the DUT. This distance results in delays, which reduce throughput and increase test time.

Therefore, a need exists for a method for testing semiconductor devices, which increases test speed and test throughput.

SUMMARY OF THE INVENTION

A method for testing semiconductor memories, in accordance with the invention includes providing a tester having a plurality of data channels. The tester operates at a first clock rate. A memory device to be tested is included with a plurality of data ports connected to the data channels. The memory device has a data compression circuit for compressing test data such that a number of the plurality of data ports are available for other functions. Data is transferred between the memory device and the tester at a rate higher than the first clock rate by employing the plurality of data ports including the number of the plurality of data ports, such that the memory device operates at the higher rate and the tester operates at the first rate. In other embodiments data ports are made available by employing an on-chip addressing method. In other embodiments, an on-chip clock receiver provides double data rate clocking of the memory device.

In other methods, the data compression circuit compresses data with a ratio of 4 to 1. The step of transferring data may include the step of transferring data in an order such that address information is conveyed by a position of the data. The memory device may include an internal clock, and the method may further include the step of operating the memory device clock to provide the higher rate for transferring data to and from the tester. The method may include the step of dividing clock cycles of the internal clock to provide the higher rate. The higher rate is preferably an integer multiple of the first rate. The integer multiple may be determined by a burst length of the memory device. The method may further include the steps of supplying the first clock rate to the memory device from the tester and doubling an internal clock rate of the memory device by employing rising and falling edges of the external clock cycle. The method may include the step of dividing the internal clock rate of the memory device to further increase the internal clock rate.

Another method for testing semiconductor memories, in accordance with the present invention, includes providing a tester having a plurality of data channels. The tester operates at a first clock rate. A memory device to be tested is provided and includes a plurality of data ports and a plurality of addressing ports connected to the data channels. The memory device includes an address register for generating addresses on the memory device such that a number of the plurality of address ports employed for addressing are available for other functions. Data is transferred between the memory device and the tester at a rate higher than the first clock rate by employing the plurality of data ports and address ports, such that the memory device operates at the higher rate and the tester operates at the first rate.

In other methods, the step of generating addresses in the address register based on a number of clock cycles is included. The step of transferring data may include the step of transferring data in an order such that address information is conveyed by a position of the data. The memory device may include an internal clock, and the method may further include the step of operating the memory device clock to provide the higher rate for transferring data to and from the tester. The method may include the step of dividing clock cycles of the internal clock to provide the higher rate. The higher rate is preferably an integer multiple of the first rate, and the integer multiple may be determined by a burst length of the memory device. The method may further include the steps of supplying the first clock rate to the memory device from the tester and doubling an internal clock rate of the memory device by employing rising and falling edges of the external clock cycle. The method may include the step of dividing the internal clock rate of the memory device to further increase the internal clock rate.

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein.

DETAILED DESCRIPTION OF PREFERRED EMBODIMENTS

The present invention provides testing methods, which include increasing the test data available to a tester. By employing data compression and/or increased clock rates on-chip, more data is simultaneously available at a semiconductor device tester. In addition, test data retrieved from the chip or device under test (DUT) may be triggered by both rising and falling edges of a clock signal. Alternately, an on-chip clock divider may be provided to increase the number of clock cycles so that, internally, the chip may perform high-speed data retrieval. The data retrieval of the tester is increased by simultaneously employing multiple data channels corresponding to the increased speed employed internally by the chip. Preferred embodiments of the present invention will now be illustratively described in greater detail.

Figure 1:
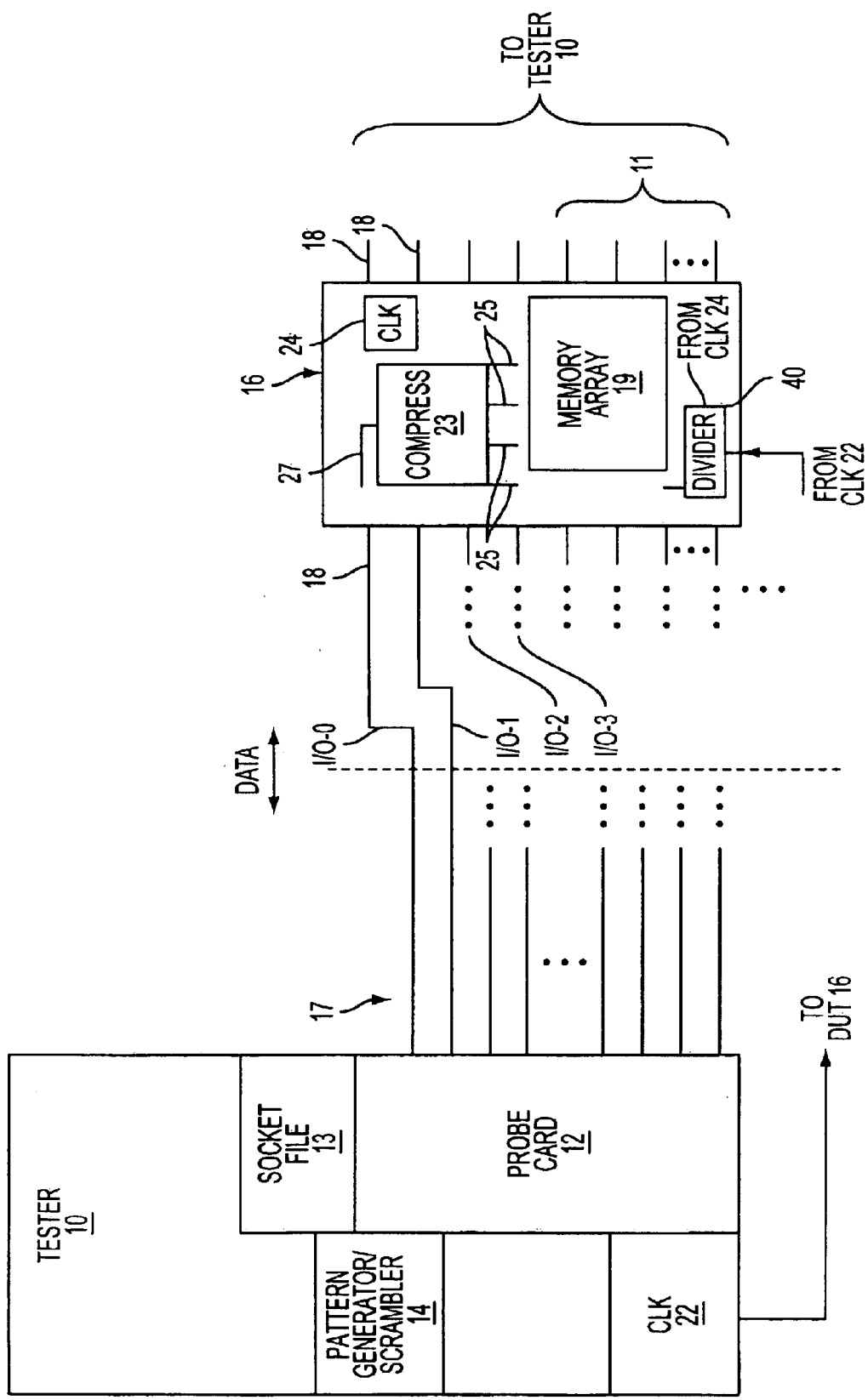
FIG. 1 is a schematic diagram of one embodiment of the present invention showing a tester and device under test system having a higher data transfer rate by employing on-chip data compression in accordance with the present invention.

Referring now in specific detail to the drawings in which like reference numerals identify similar or identical elements throughout the several views, and initially to FIG. 1, a schematic diagram of a test set up for testing semiconductor devices is illustratively shown. A tester 10 includes a probe card 12 and a socket file 13. Tester 10 includes a pattern generator and scrambler 14 for generating test patterns for testing a device under test (DUT) 16. Probe card 12 and socket file 13 are employed, as is known in the art, to provide test channels 17 or to assign data paths for testing DUT 16. DUT or chip 16 preferably includes a dynamic random access memory (DRAM) chip, embedded DRAM, synchronous DRAM (SDRAM), a double data rate SRAM, or any other memory device. Chip 16 includes a memory array 19 including memory cells and support circuitry. The present invention will illustratively be described in terms of testing memory cells or other components of memory array 19. Component tests may be employed on blocks of memory instead of individual cells. For example, blocks of memory may be sized according to available redundancy blocks.

In conventional testing, a DUT has all pins connected to a tester. The present invention takes advantage of on-chip data compression or address pin reduction methods. In this way, all data pins or ports 18 are not needed to perform data writing or retrieval for a chip since compression provides multiple results with a single bit. For example, in one instance, 4:1 compression circuits 23 (only one is shown for simplicity) are available on-chip (DUT 16) Four component test results 25 are logically combined to create a single output 27. For example, compression circuit 23 includes logic gates, which compress test data from four different results. Other compression ratios are also contemplated.

As chip 16 can perform input/output (I/O) compression on-chip, it is no longer necessary to supply all I/O pins 18 with signals to test system 10. This makes three out of four data pins 18 available for connection to channels 17 of tester.

Internally, the chip 16 knows what the expected outcome of the test result is, for example, I/O signals 0,1,2,3 should carry 0, 0, 1 and 1 respectively (e.g., bit word 0011), where 0 is a fail and a I is a pass. Therefore, the chip 16 only needs to verify the expected outcome from the actually obtained cell or component information and communicate with the test system 10 as pass or fail (1,0). In the example, this means that instead of four I/O pads/signals 18 being needed, only one pad/signal is needed to perform the same communication with the test system 10. The remaining three pins/signals 18 are available for other use.

In accordance with the present invention, by providing on-chip compression or address pin reduction (which will be explained below), some of pins 18 are available for data transfer during testing. Tester 10 includes a clock 22, and chip 16 includes a clock 24. With clocking the chip 16, internally, at 4 times the frequency of the provided external chip clock 22, 4 times the data rate may be achieved by the system as a whole. On-chip compression opens up three channels (4 total in each group) so that 4 channels are available to transfer data. In this example, since lines I/O—0, 1, 2, and 3, all provide data to tester as pass/fail signals, all tester channels 17 are utilized. This provides, for example, four times the testing speed and makes tester 10 four times faster.

In an alternate embodiment, a clock divider 40 may be employed on chip 16. Clock divider 40 divides the clock cycles to achieve a higher frequency clock signal. The output of clock divider 40 may be employed to clock chip 16. Clock divider 40 may be employed with the external clock 22 of tester or with the internal clock 24 of chip 16.

In addition, each of the four available data pins 18 now also includes address information by virtue of their position relative to each other. Chip 16 includes address lines 11, which transfer address information between chip 16 and tester 10. Since chip 16 runs in certain burst modes, for example, 1, 4, 8, or full page (e.g. 512) bursts, it is predictable which address will be provided next. Address information may be conveyed by x and y values. In one example, for a 64M chip 8 million "x" and 8 million "y" addresses are needed (bit length=14 bits for each). Since bursts of 1, 4, 8, or full pages are available, the x address for data in the burst need only be specified once for that burst. For example, I/O-0 yields data for address x=0 and y=0, I/O-1 yields data for address x=0 and y=1, I/O-2 yields data for address x=0 and y=2, I/0-3 yields data for address x=0 and y=3. Address lines need only give the x address once (0) and then the four y addresses (0–3). This reduces data transfer time between the chip and the tester.

Figure 2:
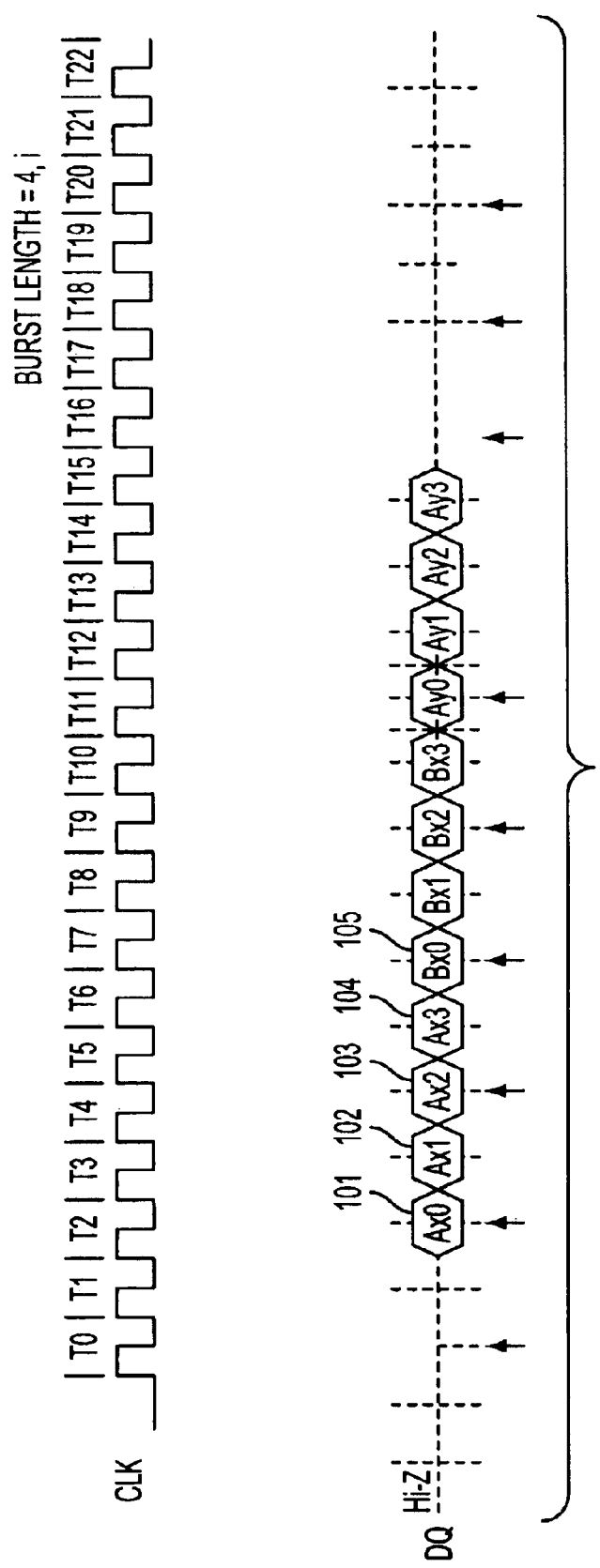
FIG. 2 is a timing diagram showing an aspect of the present invention in which address information is provided in accordance with data placement on data lines in accordance with the present invention.

Referring to FIG. 2, another example of address information being provided in output data from chip 16 (FIG. 1) is illustratively shown. A timing diagram shows a clock signal CLK generated internally on-chip. Output pins or DQs (e.g., pins 18 of FIG. 1) provide outputs. In this example, a burst length is equal to four. At each clock period, data is provided to DQ pins. As indicated, in a first clock period 101, all pins provide data from address "0" in a bank A of chip 16 (FIG. 1). In a second clock period 102, all pins provide data from address "1" of a bank A. In a third clock period 103, all pins provide data from address "2" of a bank A. In a fourth clock period 104, all pins provide data from address "3" of a bank A. In a fifth clock period 105, all pins provide data from address "0" of a bank B. This pattern continues for all banks and all addresses.

Advantageously, the present invention provides a method for running the chip circuitry at a much higher rate than the test system 10 is capable of doing. Although an illustrative compression ratio of 4:1 has been described, the compression ratio may include other values as well. Another advantage of the present invention includes testing chip 16 (FIG. 1) with a higher frequency clock. Therefore, chips with a sensitivity to clock rates at high/maximum frequencies will be tested prior to fuse blow. This higher speed testing identifies memory cells with a weakness for high/maximum frequencies and ensures that these cells will be repaired in a subsequent repair process.

Figure 3:
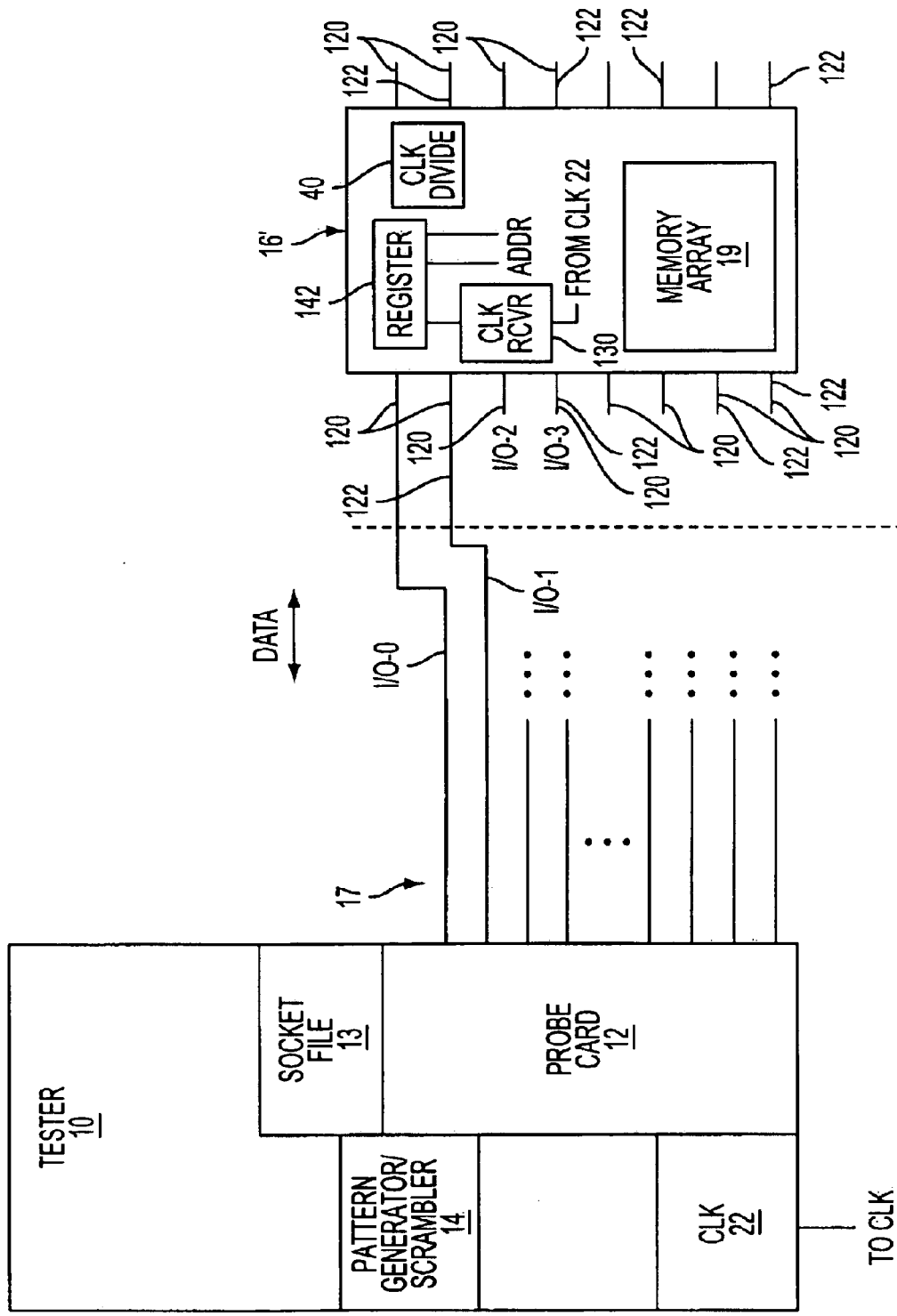
FIG. 3 is a schematic diagram of another embodiment of the present invention showing a tester and device under test

Referring to FIG. 3, another embodiment of the present invention is illustratively shown. In this embodiment, an external clock 22 of tester 10 is employed to provide a data rate to chip 16'. Advantageously, both rising and falling clock cycles are employed for signals of external clock 22. Signals from clock 22 are received by an on-chip clock receiver 130. Receiver 130 includes circuitry, which is triggered on both rising and falling edges of the clock signal. In one example, receiver 130 may be of the type employed in double data rate devices. This provides a double data rate for data writing and/or retrieval to memory cells of chip 16'. Advantageously, chip 16' runs internally at double the rate of tester 10.

The present invention employs the rising and the falling edge of the clock signal to clock chip 16' to effectively at least double the memory chip's data throughput. Clock dividers may also be employed to further increase the clock signal frequency, as described above. At this point, two data points have information written or retrieved from a memory array of chip 16'. Additional I/O pins 120 need to be provided to accommodate the additional data.

These additional I/O ports 120 are preferably existing I/O ports. Pins 120 may be made available by employing an address pin reduction scheme or data compression (see above). For example, an address pin reduction is employed which reduces the number of (e.g., address pins 122) needed to test chip 16'. The address pin reduction includes an on-chip register or counter 142, which provides address information during testing. Addresses are incremented or decremented according to counter 142, which may be controlled by a number of accesses or by a number clock cycles. In this way, address information is provided on-chip for generating data patterns and fewer address lines are needed. These address lines, for example lines 122, are now available for data transfer. By employing this scheme, additional I/O ports 120 are made available for accommodating the at least doubled data rate (e.g., lines 122).

With running pre-fuse tests in address pin reduction mode, additional I/O ports are available. This results in a reduced needed address pin count compared to the "standard" pre-fuse test. I/O signals may even be used for simple driver tasks. The address pin reduction mode also has the capability of changing the I/O port from a data input signal to a pass/fail signal.

The test system of the present invention may run under the present/current frequency or speed conditions, but receives more data per step. This permits current equipment to be employed for higher testing frequency. Further, higher testing throughput is advantageously achieved. In one embodiment, the device under test (DUT) will run internally with a doubled data rate (frequency) but output the pass/fail information two at a time in sync with the test system.

It is to be understood that aspects of the embodiments of the present invention may be combined. For example, 2:1 data compression and the use of rising and falling clock edges on-chip to double the clock rate may be employed. Clock dividers and pin reduction methods may be employed in combination as well. Those skilled in the art would be able to employ other combinations and variations in view of the present disclosure.

Having described preferred embodiments for method for high speed testing with low speed semiconductor test equipment (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A method for testing semiconductor memories, comprising the steps of:

providing a tester having a plurality of data channels, the tester operating at a first clock rate;

providing a memory device to be tested including a plurality of data ports connected to the data channels, the memory device having a data compression circuit for compressing test data such that a number of the plurality of data ports are available for other functions; and transferring data between the memory device and the tester at a rate higher than the first clock rate by employing the plurality of data ports including the number of the plurality of data ports, such that the memory device operates at the higher rate and the tester operates at the first rate.

2. The method as recited in claim 1, wherein the data compression circuit compresses data with a ratio of 4 to 1.

3. The method as recited in claim 1, wherein the step of transferring data includes the step of transferring data in an order such that address information is conveyed by a position of the data.

4. The method as recited in claim 1, wherein the memory device includes an internal clock, the method further comprising the step of operating the memory device clock to provide the higher rate for transferring data to and from the tester.

5. The method as recited in claim 4, further comprising the step of dividing clock cycles of the internal clock to provide the higher rate.

6. The method as recited in claim 1, wherein the higher rate is an integer multiple of the first rate.

7. The method as recited in claim 6, wherein the integer multiple is determined by a burst length of the memory device.

8. The method as recited in claim 1, further comprising the step of:

supplying the first clock rate to the memory device from the tester.

9. The method as recited in claim 8, further comprising the step of doubling an internal clock rate of the memory device by employing rising and falling edges of the external clock cycle.

10. The method as recited in claim 9, further comprising the step of dividing the internal clock rate of the memory device to further increase the internal clock rate.

11. A method for testing semiconductor memories, comprising the steps of:

providing a tester having a plurality of data channels, the tester operating at a first clock rate;

providing a memory device to be tested, the memory device including a plurality of data ports and a plurality of addressing ports connected to the data channels, the memory device having an address register for generating addresses on the memory device such that a number of the plurality of address ports employed for addressing are available for other functions;

performing compression of test data in the memory device; and transferring data between the memory device and the tester at a rate higher than the first clock rate by employing the plurality of data ports and address ports, such that the memory device operates at the higher rate and the tester operates at the first rate.

12. The method as recited in claim 11, further comprising the step of generating addresses in the address register based on a number of clock cycles.

13. The method as recited in claim 11, wherein the step of transferring data includes the step of transferring data in an order such that address information is conveyed by a position of the data.

14. The method as recited in claim 11, wherein the memory device includes an internal clock, the method further comprising the step of operating the memory device clock to provide the higher rate for transferring data to and from the tester.

15. The method as recited in claim 14, further comprising the step of dividing clock cycles of the internal clock to provide the higher rate.

16. The method as recited in claim 11, wherein the higher rate is an integer multiple of the first rate.

17. The method as recited in claim 16, wherein the integer multiple is determined by a burst length of the memory device.

18. The method as recited in claim 11, further comprising the step of:

supplying the first clock rate to the memory device from the tester.

19. The method as recited in claim 18, further comprising the step of doubling an internal clock rate of the memory device by employing rising an falling edges of the external clock cycle.

20. The method as recited in claim 19, further comprising the step of dividing the internal clock rate of the memory device to further increase the internal clock rate.

\* \* \* \* \*

UNITED STATES PATENT AND TRADEMARK OFFICE
CERTIFICATE OF CORRECTION

PATENT NO. : 6,718,487 B1  Page 1 of 1
APPLICATION NO. : 09/604220
DATED : April 6, 2004
INVENTOR(S) : Michael Bernhard Sommer It is certified that error appears in the above-identified patent and that said Letters Patent is hereby corrected as shown below:

Title Page (73) Assignee: correct the Assignee to --INFINEON TECHNOLOGIES RICHMOND, LP--.

Signed and Sealed this

First Day of May, 2007

JON W. DUDAS
*Director of the United States Patent and Trademark Office*